United States Patent
Tichenor

(10) Patent No.: US 6,229,871 B1
(45) Date of Patent: May 8, 2001

(54) PROJECTION LITHOGRAPHY WITH DISTORTION COMPENSATION USING RETICLE CHUCK CONTOURING

(75) Inventor: Daniel A. Tichenor, Castro Valley, CA (US)

(73) Assignee: EUV LLC, Santa Clara, CA (US)

(*) Notice: Subject to any disclaimer, the term of this patent is extended or adjusted under 35 U.S.C. 154(b) by 0 days.

(21) Appl. No.: 09/357,613

(22) Filed: Jul. 20, 1999

(51) Int. Cl.$^7$ .................................................. G21K 5/00
(52) U.S. Cl. ................................................ 378/34; 378/35
(58) Field of Search .......................... 378/34, 35, 208; 356/124; 355/75, 77, 52

(56) References Cited

U.S. PATENT DOCUMENTS

| | | |
|---|---|---|
| 4,385,434 * | 5/1983 | Zehnpfennig et al. ............ 378/34 X |
| 4,411,013 * | 10/1983 | Takasu et al. ........................... 378/34 |
| 4,475,223 * | 10/1984 | Taniguchi et al. ..................... 378/34 |
| 4,666,291 * | 5/1987 | Taniguchi et al. ..................... 355/52 |
| 4,943,733 | 7/1990 | Mori et al. |
| 5,094,536 | 3/1992 | MacDonald et al. . |
| 5,402,224 | 3/1995 | Hirukawa et al. . |
| 5,754,299 | 5/1998 | Sugaya et al. . |
| 5,828,455 | 10/1998 | Smith et al. . |
| 5,885,469 | 3/1999 | Kholodenko et al. . |

* cited by examiner

Primary Examiner—David P. Porta
(74) Attorney, Agent, or Firm—Burns, Doane, Swecker & Mathis, L.L.P.

(57) ABSTRACT

A chuck for holding a reflective reticle where the chuck has an insulator block with a non-planer surface contoured to cause distortion correction of EUV radiation is provided. Upon being placed on the chuck, a thin, pliable reflective reticle will conform to the contour of the chuck's non-planer surface. When employed in a scanning photolithography system, distortion in the scanned direction is corrected.

20 Claims, 4 Drawing Sheets

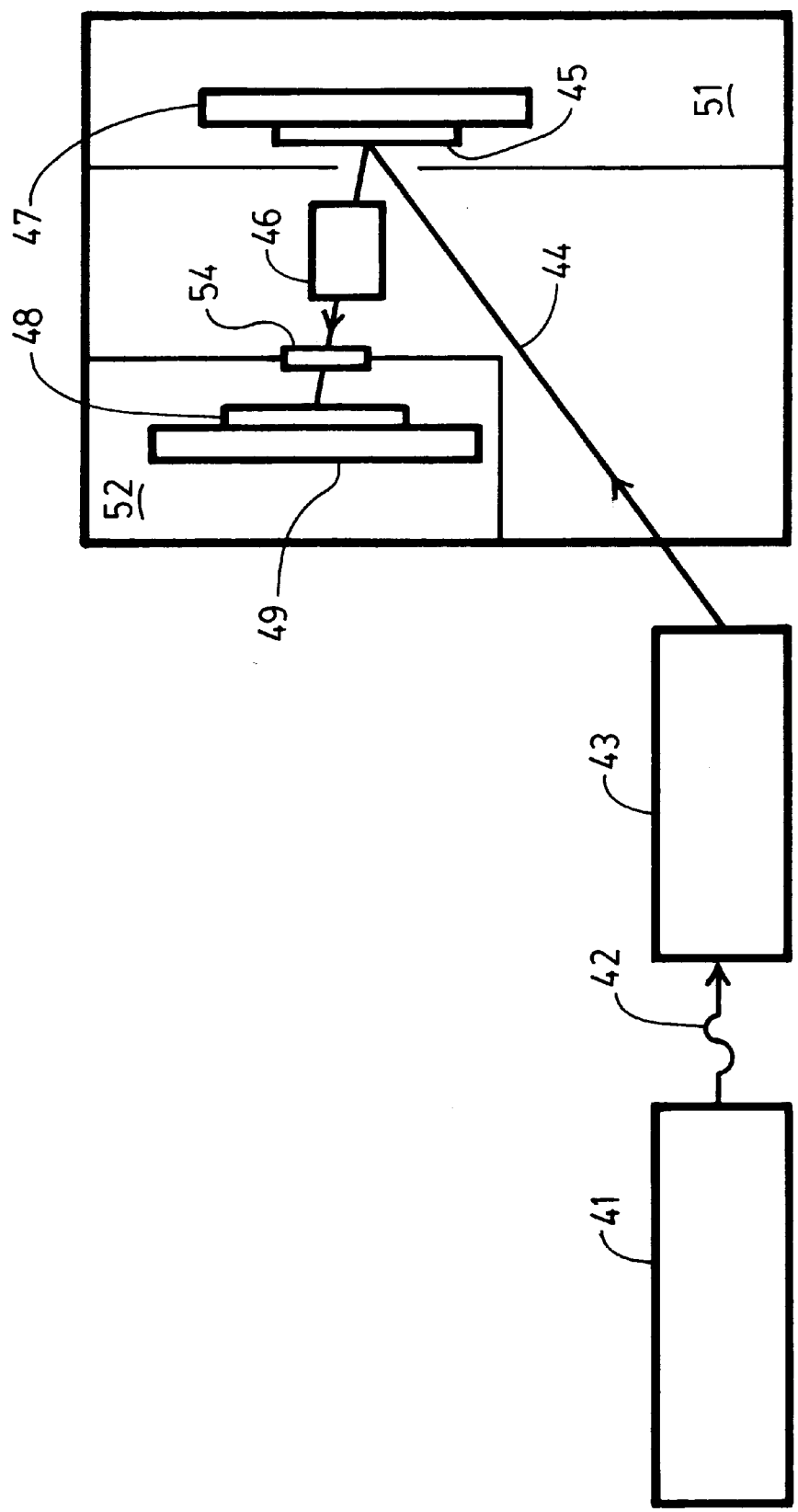
FIG._1.

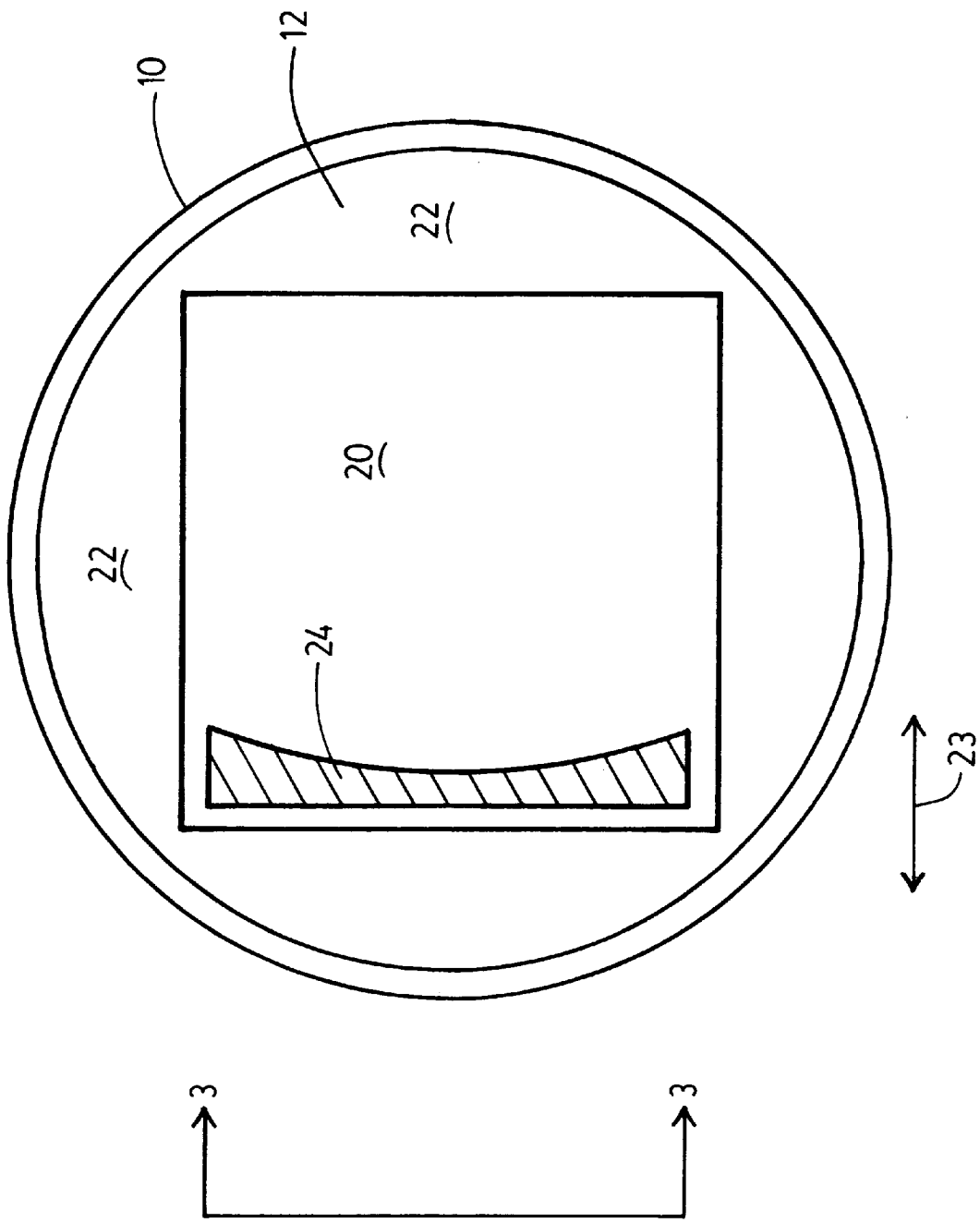
FIG._2.

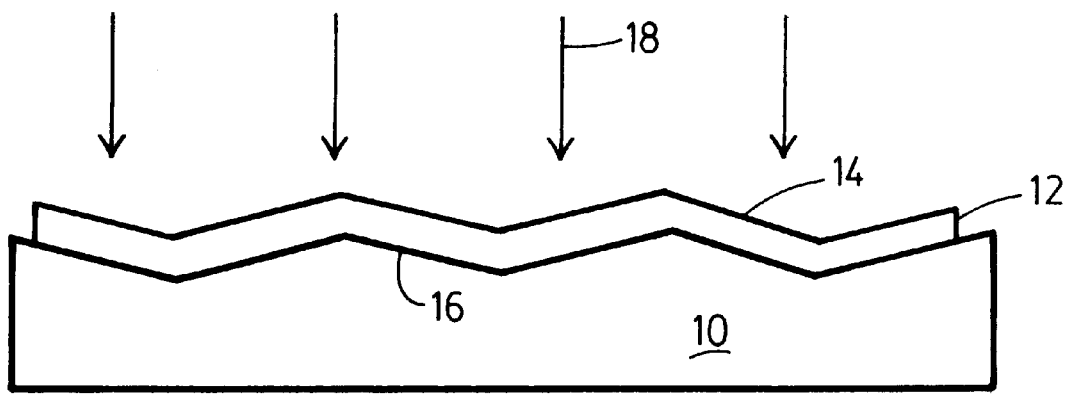
FIG._3.
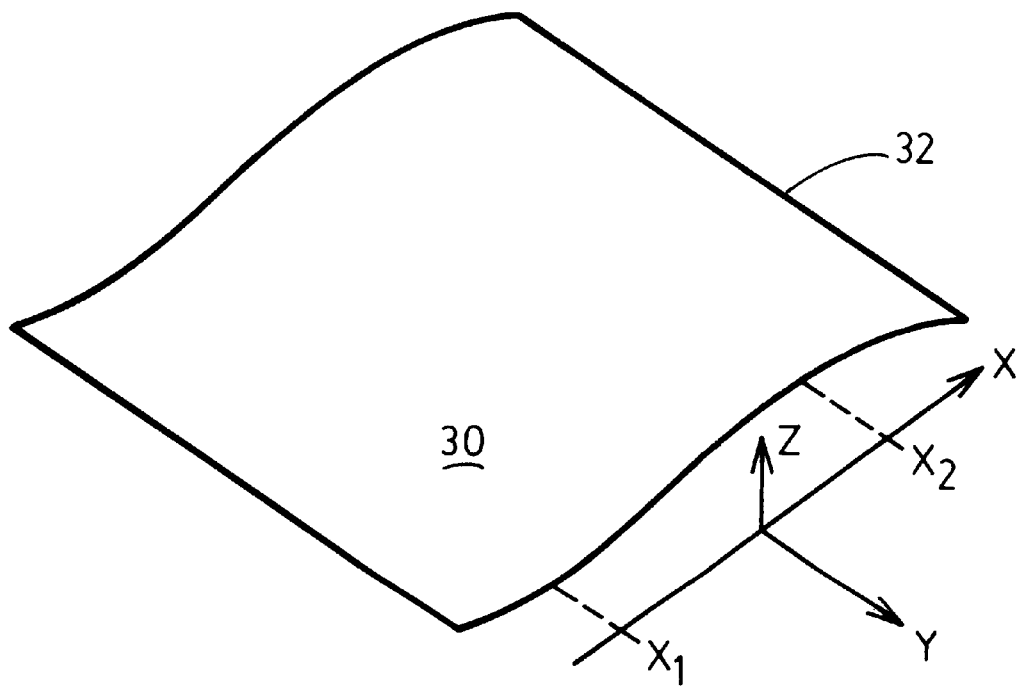
FIG._4.

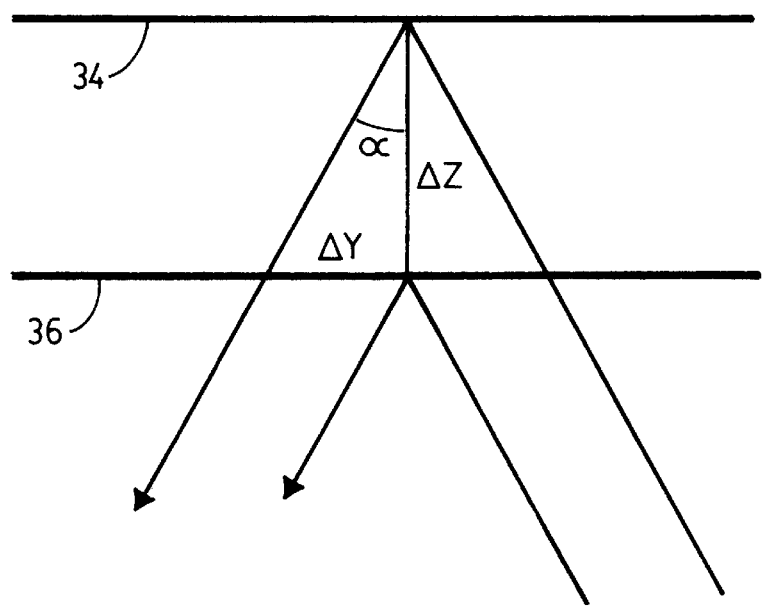
FIG._5.
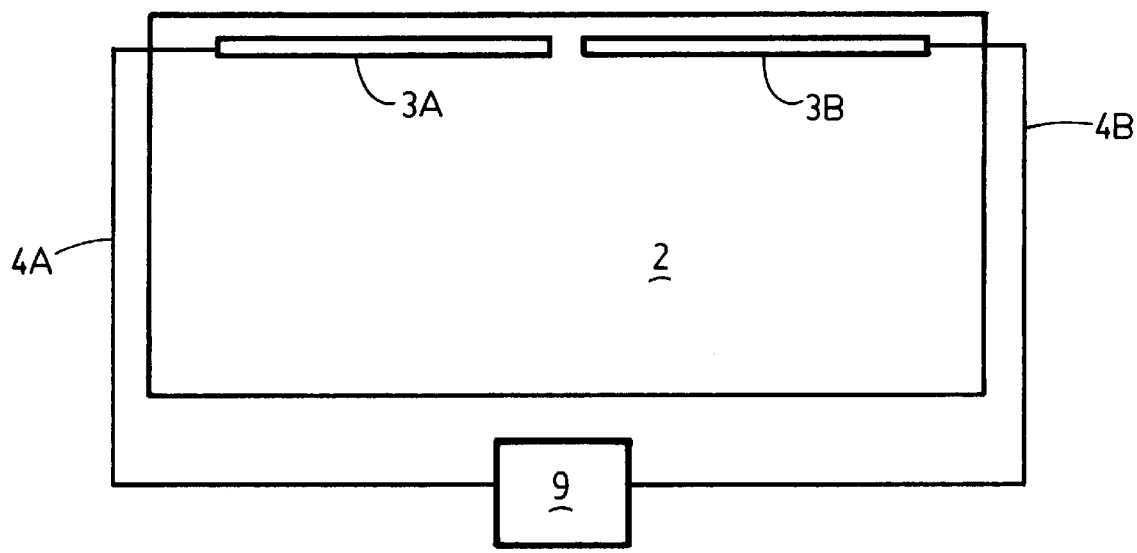
FIG._6.

PROJECTION LITHOGRAPHY WITH DISTORTION COMPENSATION USING RETICLE CHUCK CONTOURING

This invention was made with Government support under Contract No. DE-AC04-94AL85000 awarded by the U.S. Department of Energy to Sandia Corporation. The Government has certain rights to the invention.

FIELD OF THE INVENTION

The invention relates to a reticle chuck used in projection lithography that preferably employs soft x-rays and in particular to a reticle chuck having a surface that is contoured to compensate for distortions in the projected image to the reticle.

BACKGROUND OF THE INVENTION

Projection lithography is a powerful and essential tool for microelectronics processing and has supplanted proximity printing. "Long" or "soft" x-rays (a. k. a. Extreme UV) (wavelength range of $\lambda=100$ to $200$ Å) are now at the forefront of research in efforts to achieve the smaller desired feature sizes. With projection photolithography, a reticle (or mask) is imaged through a reduction-projection lens onto a wafer. Reticles for EUV projection lithography typically comprise a silicon or glass substrate coated with an EUV reflective multilayer material and an optical pattern fabricated from an EUV absorbing material that is formed on the reflective material. As is apparent, projection lithography systems are non-telecentric in that incident radiation from the condenser is not normal to the reflecting reticle surface.

In operation, EUV radiation from the condenser is projected toward the surface of the reticle and radiation is reflected from those areas of the reticle reflective surface which are exposed, i.e., not covered by the EUV absorbing material. The reflected radiation effectively transcribes the pattern from the reticle to the wafer positioned downstream from the reticle. Conventional EUV lithographic projection system designs employ reflecting reticles that have flat surfaces to avoid contributing to distortions of the projected image. A scanning exposure device uses simultaneous motion of the reticle and wafer, with each substrate being mounted on a chuck that is attached to an X-Y stage platen, to continuously project a portion of the reticle onto the wafer through a projection optics. Scanning, as opposed to exposure of the entire reticle at once, allows for the projection of reticle patterns that exceed in size that of the image field of the projection system. Laser interferometry is typically used to determine the actual stage platen position.

Among the problems encountered in EUV projection lithography are point-to-point position variations caused by non-flatness in the reflective mask. One result is that the radiation reflected to the wafer is shifted relative to the ideal position. The art is in search of techniques to reduce such distortions.

SUMMARY OF THE INVENTION

The present invention is based in part on the recognition that the surface of a reflecting reticle can be employed to correct some distortions of the projection lithography system. Further, it is recognized that given the thinness and pliability of the reticle, the reticle's surface contour will conform to that of the chuck holding the reticle.

Accordingly, in one embodiment, the invention is directed to a chuck for holding a reflective reticle, which reflects EUV radiation that is projected from an illumination device, wherein the chuck includes an insulator block that is adapted to support the reflective reticle and the insulator block has a non-planer surface contoured to cause distortion correction of the EUV radiation. Preferably, the EUV radiation is projected from a first direction that is parallel to the scanning direction and the non-planer surface is contoured to displace EUV radiation in the first direction when reflected from the reflective reticle.

In another embodiment, the invention is directed to a chuck reticle assembly that includes:

a chuck that comprises an insulator block; and a reflective reticle, that is positioned on a surface of the insulator block, wherein the reflective reticle has a non-planer surface that reflects EUV radiation that is projected from an illumination device and that is contoured to cause distortion correction of the EUV radiation.

In a further embodiment, the invention is directed to a photolithography system that includes:

chuck reticle assembly that comprises:
(i) a chuck that comprises an insulator block; and
(ii) a reflective reticle, that is positioned on a surface of the insulator block, wherein the reflective reticle has a non-planer surface that reflects EUV radiation that is projected from an illumination device and that is contoured to cause distortion correction of the EUV radiation;

a wafer positioned downstream from the reflective reticle;

an illumination device positioned upstream of the reticle chuck that projects a beam of radiation onto the mask pattern of the reflective reticle from a first direction; and a projection optics device that collects radiation reflected from the reflective reticle and directing the radiation toward the wafer, wherein the reflective reticle cancels distortions present in the projection optics device by causing the beam of radiation to be displaced in the first direction when reflected from the reflective reticle.

In yet another embodiment, the invention is directed to a photolithography process implemented in a system that includes a reticle chuck that has a surface that supports a reflective reticle, a wafer that is positioned downstream from the reflective reticle, an illumination device that projects radiation toward the reflective reticle, and a projection optics device that collects radiation reflected from the reflective reticle and directs the radiation toward the wafer, wherein the process includes the steps of:

measuring distortions in an image that is projected toward the wafer; and modifying the reflective reticle so that its reflective surface onto which the projected radiation is directed is non-planer and has a compensating contour effective to correct the distortions.

BRIEF DESCRIPTION OF THE DRAWINGS

FIG. 1 is a schematic of the main elements of an exemplary photolithography apparatus;

FIG. 2 is a plan view of the reticle;

FIG. 3 illustrates a chuck reticle assembly along the 3—3 line of FIG. 2;

FIG. 4 depicts a perspective view of a reticle contoured for distortion correction;

FIG. 5 illustrates the paths of the y components of two beams reflected from a chucked reticle; and FIG. 6 illustrates an electrostatic chuck.

DETAILED DESCRIPTION OF THE INVENTION

The reticle chuck of the present invention is particularly suited for photolithography systems where the reticle chuck is positioned in a vacuum chamber. FIG. 1 schematically depicts an apparatus for EUV lithography that comprises a radiation source 41, such as a synchrotron or a laser plasma source, that emits EUV radiation 42 into condenser 43 which in turn emits beam 44 that illuminates a portion of reticle or mask 45. The emerging patterned beam is introduced into the projection or imaging optics device 46 which projects an image of mask 45, shown mounted on mask stage platen assembly 47, onto wafer 48 which is mounted on wafer stage platen assembly 49. The stage platen assemblies 47 and 49 comprise a stage platen and associated components for its maneuver. Precision movement of stage platen assemblies can be implemented by known mechanisms as described, for example, in U.S. Pat. Nos. 5,623,853 and 5,699,621 which are incorporated herein by reference.

The stage platen assemblies 47 and 49 are preferably housed in separate chambers that is separated from the other elements of the photolithography system located upstream as illustrated in FIG. 1. Stage platen assembly 47 supporting mask 45 is housed in mask chamber or zone 51 which is typically maintained at sub-atmospheric pressure preferably between 1 mTorr to 100 mTorr. Similarly, stage platen assembly 49 supporting wafer 48 is housed in wafer chamber or zone 52 which is preferably maintained at a pressure below about 100 mTorr. Chamber 52 includes a window 54 that is made of a suitable material that transmits EUV. The other elements can be housed in one or more chambers which are preferably maintained in vacuum to minimize attenuation of the EUV radiation. EUV radiation projected from the mask and translated by a camera travels through an aperture in the wafer chamber. The individual elements that form the EUV lithography device as shown in FIG. 1 can comprise conventional optical devices, e.g., condensers, cameras, and lens, for projection EUV lithography. Preferably the EUVL device employs a condenser that collects EUV for illuminating a ringfield camera.

As illustrated in FIG. 1, the upper surface of mask 45 is facing the upper surface of the wafer 52. In one embodiment, the reticle is inverted so that gravity pulls the wafer from the chuck. A higher clamping force, e.g., electrostatic charge, will be needed to account for the gravitational force. Preferably, the chuck is an electrostatic chuck (ESC) because this design combines the advantages of the more uniform clamping ability of vacuum chucks and the usability in vacuum environments of mechanical chucks. In an ESC, a voltage difference is applied between the substrate (e.g, reticle or wafer) and a metallic electrode or pair of electrodes that is embedded in an insulator block, with the substrate and electrode(s) being separated by an interposed dielectric layer. The magnitude of the electrostatic clamping force thus generated depends on the applied voltage, the separation between the wafer and the electrode(s), and the dielectric constant of the interposed layer. As a result of their advantages over other chucking devices, ESCs have gained wide usage in the semiconductor processing industry. ESC devices are known in the art and for described, for example in U.S. Pat. Nos. 5,221,403, 5,835,333 and 5,835,334 which are incorporated herein by reference.

FIG. 2 illustrates the reflective reticle 12 that is secured to chuck 10. The surface of the reflective reticle includes an active region 20 where the mask pattern is formed and inactive regions 22 that border the active region. During projection printing, a beam of EUV radiation is projected onto the reticle from an illumination device located upstream from the reflective mask and is thereafter a projected image is reflected from the active region onto the wafer (not shown). A preferred form of EUV lithography projection optics employs a projection optics devices that comprises ringfield camera which is further described for example in U.S. Pat. No. 5,315,629 which is incorporated herein by reference. As shown in FIG. 2, the reticle is swept horizontally in direction 23 by an arc-shaped illumination region 24 which is typically 1 to 2 mm wide by 26 mm long. In a preferred embodiment, projection comprises reduction ringfield scanning in which an imaged arcuate region on the image plane is of reduced size relative to that of the subject arcuate region so that the imaged pattern is reduced in size relative to the mask region.

The beam of EUV radiation is not orthogonal to the plane defined by the active region surface of the reticle rather the beam typically ranges from about 1.5 to 6 degrees from the normal to the plane. In the preferred photolithography system, this non-telecentricity angle α is 5.4°. The energy from an illumination device (e.g., condenser) of the lithography system preferably illuminates only the active region. In full-field exposure (as distinguished from the scanning shown) essentially the entire active region 20 is illuminated simultaneously.

FIG. 3 shows a highly exaggerated cross-sectional view of the inventive reticle chuck assembly that comprises a silicon substrate 12 supported on chuck 10. As is apparent, the surface 16 of chuck 10 is non-planer. The effect is that when the then silicon substrate 12 is placed on the surface 16 of the chuck, the upper surface 14 of the reticle will conform to the contour of surface 16 of the chuck. The beam of EUV 18 is projected onto the surface 14 of the reticle. It should be noted that for photolithography systems employing EUV radiation, the chuck when contoured to a prescribed shape must be fabricated to the same tolerance which is typically 75 nm to 300 nm peak to valley and nominally 100 nm peak to valley as required in the flat chuck. This tolerance is within the state of the art for aspherical surfaces.

The present invention employs reticles made by conventional means. The only limitation is that the reticle be sufficiently thin to conform to the contour of the chuck. Typically, the thickness of the reticle ranges from about 0.5 mm to 2.0 mm and preferably from about 0.725 mm to 0.775 mm.

The contour of the chuck is prescribed to cancel distortion from sources of the projection system (e.g., projection optics device 46 of FIG. 1) located downstream from the reticle. The present invention is applicable to either full field or scanning systems. In general this approach can be used for either full field or scanning systems. In either case distortion can be corrected in only one direction. That direction is in the plane (call it the y-z plane) containing the normal to the reticle and the chief ray of the projection system which is depicted in FIG. 4. As shown, the contoured active surface of a reticle 32 when attached to a chuck (not shown) that has been contoured for distortion compensation. The reticle surface 30 is employed in a scanning system that scans in the y direction. For illustrative purposes the reticle is illuminated from below. The reticle is contoured such that it is essentially planer (i.e., flat) in the y direction and non-flat in the non-scanned x direction. The arc-shaped region 34 is projected in the z-y plane. Specifically, as shown in FIG. 5, at points such as $x_1$ of the reticle surface 34 where the surface of the chucked reticle is displaced downward, the image point in the projected image is displaced in the positive y direction. Conversely, at points such as $x_2$ of the reticle surface 36 where the surface of the chucked reticle is displaced upward, the image point in the projected image is displaced in the negative y direction.

From the geometry of FIG. 5, it is evident that the y component of distortion, which is measured at the wafer, is given by the equation:

$$\Delta y_{reticle} = \Delta z \tan(\alpha), \text{ where } \Delta z \text{ is the difference in the vertical direction}$$

between chucked reticle surface at points $x_1$ and $x_2$ that are located in the cross-scan direction, and $\alpha$ is the non-telecentricity angle. In photolithography systems where the reflected radiation is projected to the wafer by a projection optics device having by a magnification M of less than 1, the y component of the distortion is given by the equation: $\Delta y_{wafer} = M \Delta z \tan(\alpha)$. In a preferred system M is 0.25.

Since a thin reticle conforms to the contour of the chuck, the chuck (and not the reticle) is contoured for a specific projection system. The chuck contour becomes a compensator in the design and alignment of the projection system.

In operation, in designing a contoured chuck for distortion compensation, the distortion introduced by devices (e.g., projection optics device) of the photolithography system downstream from the reticle is first measured. Techniques for measuring distortion are known in the art and are described, for example, in U.S. Pat. Nos. 5,402,224 and 4,943,733 which are incorporated herein by reference. A preferred device for distortion measurements is the 5200XP Overlay Metrology System from KLA-Tencor Corp. San Jose, Calif.

Once the distortion is measured, the surface of the insulator block of the chuck is contoured by standard techniques to compensate for the distortion. Upon placement of the thin reflective reticle on the contoured surface, the surface of the active region will conform to shape of the chuck contoured surface. The insulator block is preferably made of any suitable ceramic material preferably with a low expansion coefficient. A preferred material is glass ceramic that is commercially available such as ZERODUR from Schott Jenaer Glas, GmbH, Mainz, Germany.

A number of different chucks are widely used to hold semiconductor wafers during processing. Mechanical chucks can secure the wafer by using arms or clamps to press the wafer against a supporting surface. Vacuum chucks secure the wafer by creating a vacuum beneath the wafer backside, thereby generating a clamping force due to the pressure differential between the processing chamber which is at higher pressure and the wafer backside. Vacuum chucks can provide a more uniform clamping force than can mechanical chucks, but in the low pressure environments required for many semiconductor processing applications, the pressure differential is insufficient to generate an adequate clamping force.

Electrostatic chucks combine the advantages of the more uniform clamping ability of vacuum chucks and the usability in vacuum environments of mechanical chucks. In an electrostatic chuck, a voltage difference is applied between the wafer and a metallic electrode or pair of electrodes, the wafer and electrode(s) being separated by an interposed dielectric layer. The magnitude of the electrostatic clamping force thus generated depends on the applied voltage, the separation between the wafer and the electrode(s), and the dielectric constant of the interposed layer.

As shown in FIG. 6, the electrostatic chuck comprises an insulator block 2 having flat plate electrodes 3A and 3B that are embedded therein and that are separated by a gap in between them. The electrodes are positioned preferably just below the surface of the insulator block 2 which is shaped and sized to support a reticle (not shown) thereon and is attached to a support base 6 which is typically metal, e.g., copper. The shape and sized of the insulator varies according to the dimensions of the substrate. The electrodes 3A and 3B are connected through wires 4A and 4B, respectively, to the source of electrical potential 9. Electrostatic chucks are known in the art and are described, for example in U.S. Pat. Nos. 5,221,403, 5,835,333 and 5,835,334 which are incorporated herein.

The EUV lithography device of the present invention is particularly suited for fabricating integrated devices that comprise at least one element having a dimension of $\leq 0.25$ $\mu$m. The process comprises construction of a plurality of successive levels by lithographic delineation using a mask pattern that is illuminated to produce a corresponding pattern image on the device being fabricated, ultimately to result in removal of or addition of material in the pattern image regions.

The inventive technique corrects only one component of a two-dimensional distortion field. Specifically, the distortion in the non-scanned direction is not corrected, nevertheless, the invention will, in general, provide an improvement in distortion if applied after the projection system is aligned. To take full advantage of this technique, the optical design and alignment of the projection system should also be corrected for distortion in the x (non-scanned) direction to within a tight tolerance. However, y distortion may be allowed to deviate outside the system tolerance by perhaps an order of magnitude or more. The y component of distortion is constrained to the range that can be corrected by chuck contouring. Since distortion is a severe constraint in both the optical design and alignment of the projection system, relief in the distortion requirements offers the potential for significant performance improvement in the EUV projection systems.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A chuck/reflective reticle assembly for use in photolithography with a source of illumination that projects a beam of radiation that comprises a chuck having a contoured upper surface with a shape that is essentially planer in a first direction and non-planer in a second direction wherein a reflective reticle having a thickness of about 0.5 mm to 2.0 mm is positioned on the contoured upper surface of the chuck so that the reflective reticle conforms to the contoured upper surface of the chuck such that the reflective reticle defines an active region with an upper surface having a shape matching that of the contoured upper surface of the chuck whereby the active region reflects the beam of EUV radiation and causes distortion correction of the EUV radiation.

2. The chuck/reflective reticle assembly of claim 1 wherein the thickness of the reflective reticle is between about 0.725 mm to 0.775 mm.

3. The chuck/reflective reticle assembly of claim 1 wherein the contoured upper surface of the chuck has a tolerance of 75 nm to 300 nm.

4. A chuck reticle assembly that comprises:

a chuck that comprises an insulator block; and a reflective reticle, that is positioned on a surface of the insulator block, wherein the reflective reticle has a non-planer surface that reflects EUV radiation that is projected from an illumination device and that is contoured to cause distortion correction of the EUV radiation.

5. The chuck reticle assembly of claim 4 wherein the surface of the insulator block has a non-planer surface contoured to cause distortion correction of the EUV radiation and wherein the reflective surface of the reflective reticle has a contour that conforms to that of the non-planer surface of the insulator block.

6. The chuck reticle assembly of claim 4 the EUV radiation is projected from a first direction and wherein the non-planer surface is contoured to displaced EUV radiation in the first direction when reflected from the reflective reticle.

7. The chuck reticle assembly of claim 5 wherein the non-planer surface of the insulator block has a tolerance of 75 nm to 300 nm.

8. The chuck reticle assembly of claim 4 wherein the reticle has a 1 0 thickness of between about 0.5 mm to 2.0 mm.

9. A photolithography system comprising:

chuck reticle assembly that comprises:
  (i) a chuck that comprises an insulator block; and
  (ii) a reflective reticle, that is positioned on a surface of the insulator block, wherein the reflective reticle has a non-planer surface that reflects EUV radiation that is projected from an illumination device and that is contoured to cause distortion correction of the EUV radiation;

a wafer positioned downstream from the reflective reticle;

an illumination device positioned upstream of the reticle chuck that projects a beam of radiation onto the mask pattern of the reflective reticle from a first direction; and a projection optics device that collects radiation reflected from the reflective reticle and directing the radiation toward the wafer, wherein the reflective reticle cancels distortions present in the projection optics device by causing the beam of radiation to be displaced in the first direction when reflected from the reflective reticle.

10. The photolithography system of claim 9 wherein the surface of the insulator block has a non-planer surface contoured to cause distortion correction of the EUV radiation and wherein the reflective surface of the reflective reticle has a contour that conforms to that of the non-planer surface of the insulator block.

11. The photolithography system of claim 9 the EUV radiation is projected from a first direction and wherein the non-planer surface is contoured to displaced EUV radiation in the first direction when reflected from the reflective reticle.

12. The photolithography system of claim 10 wherein the non-planer surface of the insulator block has a tolerance of 75 nm to 300 nm.

13. The photolithography system of claim 9 wherein the reticle has a thickness of between about 0.5 mm to 2.0 mm.

14. A photolithography process implemented in a system that includes a reticle chuck that has a surface that supports a reflective reticle, a wafer that is positioned downstream from the reflective reticle, an illumination device that projects radiation toward the reflective reticle, and a projection optics device that collects radiation reflected from the reflective reticle and directs the radiation toward the wafer, wherein the process comprises the steps of:

measuring distortions in the radiation that is projected toward the reflective reticle; and modifying the reflective reticle so that its reflective surface onto which the projected radiation is directed is non-planer and has a compensating contour effective to correct the distortions.

15. The process of claim 14 wherein the step of modifying the reflective reticle comprises adjusting the surface of the chuck so that it has a contour that creates the compensating contour when the reflective reticle is placed onto the chuck surface.

16. The process of claim 14 wherein the reflective reticle is positioned on a surface of the chuck, wherein the reflective reticle has a non-planer surface that reflects EUV radiation that is projected from an illumination device and that is contoured to cause distortion correction of the EUV radiation.

17. The process of claim 14 wherein chuck has a non-planer surface contoured to cause distortion correction of the EUV radiation and wherein the reflective surface of the reflective reticle has a contour that conforms to that of the non-planer surface of the insulator block.

18. The process of claim 14 wherein the radiation is projected from a first direction and wherein the non-planer surface is contoured to displaced EUV radiation in the first direction when reflected from the reflective reticle.

19. The process of claim 14 wherein the reticle has a thickness of between about 0.5 mm to 2.0 mm.

20. The chuck/reflective reticle assembly of claim 1 wherein the contoured surface of the chuck is made of a ceramic material.

* * * * *